(12) United States Patent
Han et al.

(10) Patent No.: US 11,243,243 B2
(45) Date of Patent: Feb. 8, 2022

(54) CIRCUIT FOR ARC DETECTION IN DIRECT CURRENT AND MICROPROCESSOR

(71) Applicant: Huawei Technologies Co., Ltd., Shenzhen (CN)

(72) Inventors: Jintao Han, Shanghai (CN); Shengjie Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 635 days.

(21) Appl. No.: 16/229,315

(22) Filed: Dec. 21, 2018

(65) Prior Publication Data
US 2019/0120894 A1      Apr. 25, 2019

Related U.S. Application Data

(63) Continuation of application No. PCT/CN2017/079602, filed on Apr. 6, 2017.

(30) Foreign Application Priority Data

Jun. 22, 2016   (CN) .......................... 201610460004.7

(51) Int. Cl.
*G01R 31/12*   (2020.01)
*H02S 50/10*   (2014.01)
*G01R 19/00*   (2006.01)

(52) U.S. Cl.
CPC ..... *G01R 31/1272* (2013.01); *G01R 19/0092* (2013.01); *H02S 50/10* (2014.12)

(58) Field of Classification Search
CPC ................ G01R 31/00; G01R 31/1272; G01R 19/0092; H02S 50/10; Y02E 10/50
(Continued)

(56) References Cited

U.S. PATENT DOCUMENTS 5,452,223 A    9/1995  Zuercher et al.
9,366,716 B2 * 6/2016  Zach ..................... G01R 31/12
(Continued)

FOREIGN PATENT DOCUMENTS

CN        1129809 A     8/1996
CN      101556301 A    10/2009
(Continued)

OTHER PUBLICATIONS

Machine Translation and Abstract of Chinese Publication No. CN101556301, Oct. 14, 2009, 39 pages.
(Continued)

*Primary Examiner* — Tung X Nguyen
*Assistant Examiner* — Robert P Alejnikov, Jr.
(74) *Attorney, Agent, or Firm* — Conley Rose, P.C.

(57) ABSTRACT

A circuit for arc detection in a direct current and a microprocessor to resolve a problem of low accuracy of a detection result of an existing circuit for arc detection in a direct current, where the circuit includes a current sampling circuit, a first circuit, a second circuit, and a microprocessor. The current sampling circuit is configured to perform current sampling on the direct current, and output a current sampling signal of the direct current. The first circuit is configured to output a time domain signal including at least one pulse. The second circuit is configured to output a frequency domain signal of the current sampling signal after amplifying and filtering the current sampling signal. The microprocessor is configured to determine that an arc exists in the direct current when a counting result of the quantity of arc events meets a preset condition.

20 Claims, 10 Drawing Sheets

(58) Field of Classification Search
USPC .......................................................... 702/58
See application file for complete search history.

(56) References Cited

U.S. PATENT DOCUMENTS

| | | | |
|---|---|---|---|
| 2009/0284265 | A1 | 11/2009 | Ohta et al. |
| 2010/0213996 | A1 | 8/2010 | Koch |
| 2012/0089266 | A1 | 4/2012 | Tomimbang et al. |
| 2013/0169290 | A1 | 7/2013 | Shea et al. |
| 2014/0195177 | A1* | 7/2014 | Kang ................. G01R 31/1227 702/58 |
| 2014/0347066 | A1 | 11/2014 | Zach |
| 2015/0346261 | A1* | 12/2015 | Chen ........................ H02H 3/16 361/93.6 |
| 2018/0313887 | A1 | 11/2018 | Zhang et al. |

FOREIGN PATENT DOCUMENTS

| | | |
|---|---|---|
| CN | 101673934 A | 3/2010 |
| CN | 101702936 A | 5/2010 |
| CN | 102253293 A | 11/2011 |
| CN | 102279339 A | 12/2011 |
| CN | 102565578 A | 7/2012 |
| CN | 103116093 A | 5/2013 |
| CN | 103245897 A | 8/2013 |
| CN | 103812081 A | 5/2014 |
| CN | 103913663 A | 7/2014 |
| CN | 104215826 A | 12/2014 |
| CN | 104614608 A | 5/2015 |
| CN | 104678265 A | 6/2015 |
| CN | 105093082 A | 11/2015 |
| CN | 105403790 A | 3/2016 |
| CN | 106199131 A | 12/2016 |
| DE | 19530776 C1 | 12/1996 |
| WO | 2008150136 A1 | 12/2008 |
| WO | 2010094049 A1 | 8/2010 |

OTHER PUBLICATIONS

Machine Translation and Abstract of Chinese Publication No. CN101673934, Mar. 17, 2010, 20 pages.
Machine Translation and Abstract of Chinese Publication No. CN102253293, Nov. 23, 2011, 31 pages.
Machine Translation and Abstract of Chinese Publication No. CN102565578, Jul. 11, 2012, 10 pages.
Machine Translation and Abstract of Chinese Publication No. CN103116093, May 22, 2013, 18 pages.
Machine Translation and Abstract of Chinese Publication No. CN103245897, Aug. 14, 2013, 12 pages.
Machine Translation and Abstract of Chinese Publication No. CN103812081, May 21, 2014, 11 pages.
Machine Translation and Abstract of Chinese Publication No. CN103913663, Jul. 9, 2014, 29 pages.
Machine Translation and Abstract of Chinese Publication No. CN104614608, May 13, 2015, 11 pages.
Machine Translation and Abstract of Chinese Publication No. CN104678265, Jun. 3, 2015, 20 pages.
Machine Translation and Abstract of Chinese Publication No. CN105403790, Mar. 16, 2016, 13 pages.
Machine Translation and Abstract of Chinese Publication No. CN106199131, Dec. 7, 2016, 37 pages.
Machine Translation and Abstract of German Publication No. DE19530776C1, Dec. 12, 1996, 15 pages.
Xiaoming, L., et al., "The Arc Fault Detection Based on the Current Signal Short Time Zero Crossing Rate," Transactions of China Electrotechnical Society, vol. 30, No. 13, Jul. 2015, 9 pages.
Foreign Communication From A Counterpart Application, Chinese Application No. 201610460004.7, Chinese Office Action dated Jul. 3, 2018, 9 pages.
Foreign Communication From A Counterpart Application, Chinese Application No. 201610460004.7, Chinese Office Action dated Dec. 5, 2018, 9 pages.
Foreign Communication From A Counterpart Application, PCT Application No. PCT/CN2017/079602, English Translation of International Search Report dated Jul. 5, 2017, 2 pages.
Foreign Communication From A Counterpart Application, PCT Application No. PCT/CN2017/079602, English Translation of Written Opinion dated Jul. 5, 2017, 6 pages.
Machine Translation and Abstract of Chinese Publication No. CN104215826, Dec. 17, 2014, 11 pages.
Foreign Communication From A Counterpart Application, European Application No. 17814469.7, Extended European Search Report dated Apr. 2, 2019, 7 pages.

* cited by examiner

CIRCUIT FOR ARC DETECTION IN DIRECT CURRENT AND MICROPROCESSOR

CROSS-REFERENCE TO RELATED APPLICATIONS

This application is a continuation of International Patent Application No. PCT/CN2017/079602 filed on Apr. 6, 2017, which claims priority to Chinese Patent Application No. 201610460004.7 filed on Jun. 22, 2016. The disclosures of the aforementioned applications are hereby incorporated by reference in their entireties.

TECHNICAL FIELD

The present disclosure relates to the field of electrical technologies, and in particular, to a circuit for arc detection in a direct current and a microprocessor.

BACKGROUND

When a high-voltage direct current line is faulty or a joint of a device is faulty in an electrical system, an arc may be generated in a direct current of the electrical system. The arc in the direct current may cause electric leakage of a device or a line in the electrical system, or cause a fire, and consequently the electrical system is damaged, or even human life and property safety are endangered. For example, in a photovoltaic (PV) power system, a PV panel generates a direct current under sun radiation. Because solar panels are usually disposed in a residential building and a commercial building, if a fault in the PV power system causes an arc in a direct current, an electric shock or a fire may be caused, which endangers human life and property safety.

Therefore, it is particularly important to accurately detect whether an arc exists in a direct current.

In other approaches, a process in which a circuit for arc detection in a direct current detects whether an arc exists in the direct current is as follows. The direct current is input to a signal conditioning circuit in the direction circuit, and after being amplified and filtered, the direct current is input to a microprocessor in the detection circuit. The microprocessor performs frequency domain analysis and time domain analysis on a signal obtained after processing by the signal conditioning circuit, i.e., separately determines, in frequency domain and time domain, whether the direct current has an arc characteristic. When it is determined, in frequency domain and time domain, that the direct circuit has an arc characteristic, it can be determined that an arc exists in the direct current.

The electrical system is affected by environmental factors during operation, and some environmental factors affect a result of determining, by the microprocessor, whether the direct current has an arc characteristic. For example, in the PV power system, a change of sun radiation or temperature causes a sudden change of output power of the PV panel, and further causes a sudden change of the direct current output by the PV panel.

Therefore, when the arc detection circuit provided in the other approaches is used, a sudden change of a direct current that is caused by a change of an environmental factor such as sun radiation or temperature is determined as an arc characteristic, and then it is determined, according to the arc characteristic, that an arc exists in the direct current, resulting in reduced accuracy of a detection result of arc detection performed by the circuit for arc detection in the direct current.

In conclusion, accuracy of the detection result of the other approaches circuit for arc detection in the direct current is low.

SUMMARY

Embodiments of the present disclosure provide a circuit for arc detection in a direct current and a microprocessor in order to resolve a problem of low accuracy of a detection result of an existing circuit for arc detection in a direct current.

According to a first aspect, an embodiment of the present disclosure provides a circuit for arc detection in a direct current, including a current sampling circuit configured to perform current sampling on the direct current, and output a current sampling signal of the direct current, a first circuit configured to receive the current sampling signal output by the current sampling circuit, and output a time domain signal after processing the current sampling signal, where the time domain signal includes at least one pulse, and the at least one pulse is used to indicate a time domain change rate of the current sampling signal, a second circuit configured to receive the current sampling signal output by the current sampling circuit, and output a frequency domain signal of the current sampling signal after amplifying and filtering the current sampling signal, and a microprocessor configured to receive the time domain signal output by the first circuit and the frequency domain signal output by the second circuit, count a quantity of arc events based on results of analysis on the time domain signal and the frequency domain signal, and when a counting result of the quantity of arc events meets a preset condition, determine that an arc exists in the direct current.

According to the foregoing solution, the current sampling circuit performs current sampling on the direct current, and outputs the current sampling signal of the direct current. The first circuit receives the current sampling signal and outputs, after processing the current sampling signal, the time domain signal including the at least one pulse, where the at least one pulse is used to indicate the time domain change rate of the current sampling signal. The second circuit receives the current sampling signal, and outputs the frequency domain signal of the current sampling signal after amplifying and filtering the current sampling signal. The microprocessor receives the time domain signal output by the first circuit and the frequency domain signal output by the second circuit, counts the quantity of arc events based on the results of analysis on the time domain signal and the frequency domain signal, and determines that an arc exists in the direct current when the counting result of the quantity of arc events meets the preset condition.

Because the at least one pulse in the time domain signal reflects the time domain change rate of the current sampling signal, when analyzing the time domain signal, the microprocessor needs to consider whether the time domain change rate of the current sampling signal falls within an arc change rate range. Therefore, according to the solution provided in the first aspect, when an environmental factor causes a change of the current sampling signal, it is not considered by mistake that an arc exists in the direct current, thereby improving accuracy of a detection result of the circuit for arc detection in the direct current.

In a possible implementation, the microprocessor is further configured to set the quantity of arc events to an initial value before receiving the time domain signal output by the first circuit and the frequency domain signal output by the second circuit, and when counting the quantity of arc events based on the results of analysis on the time domain signal and the frequency domain signal, the microprocessor is further configured to analyze, in a specified sequence, one of the at least one pulse included in the time domain signal, and if a width of the pulse is greater than or equal to a first threshold and the frequency domain signal has an arc characteristic, increase the quantity of arc events by 1, or otherwise, decrease the quantity of arc events by 1.

According to the foregoing solution, the microprocessor counts the quantity of arc events, and when a pulse width of a pulse is greater than or equal to the first threshold and the frequency domain signal has an arc characteristic, increases the quantity of arc events by 1, or otherwise, decreases the quantity of arc events by 1. Therefore, a possibility that an arc exists in the direct current can be measured based on a value of the quantity of arc events. The quantity of arc events is increased by 1 when the possibility that an arc exists in the direct current grows, and the quantity of arc events is decreased by 1 when the possibility that an arc exists in the direct current reduces. A method for measuring the possibility that an arc exists in the direct current is provided. In addition, an operation of decreasing the quantity of arc events by 1 also avoids the following problem The quantity of arc events is increased excessively fast, and therefore it is frequently determined that an arc exists in the direct current, and then device shutdown is frequently triggered.

In a possible implementation, the microprocessor is further configured to set the quantity of arc events to an initial value before receiving the time domain signal output by the first circuit and the frequency domain signal output by the second circuit, and when counting the quantity of arc events based on the results of analysis on the time domain signal and the frequency domain signal, the microprocessor is further configured to, if a width of any one of the at least one pulse included in the time domain signal is greater than or equal to a second threshold and the frequency domain signal has an arc characteristic, increase the quantity of arc events by 1, otherwise, decrease the quantity of arc events by 1, or if a width of each of the at least one pulse included in the time domain signal is greater than or equal to a second threshold and the frequency domain signal has an arc characteristic, increase the quantity of arc events by 1, otherwise, decrease the quantity of arc events by 1.

According to the foregoing solution, the microprocessor counts the quantity of arc events, and when a width of any one of the at least one pulse is greater than or equal to the second threshold or the width of each of the at least one pulse is greater than or equal to the second threshold, and the frequency domain signal has an arc characteristic, increases the quantity of arc events by 1, or otherwise, when a width of any one of the at least one pulse is less than the second threshold or the width of each of the at least one pulse is less than the second threshold, and the frequency domain signal does not have an arc characteristic, decreases the quantity of arc events by 1. Therefore, a possibility that an arc exists in the direct current can be measured based on a value of the quantity of arc events. The quantity of arc events is increased by 1 when the possibility that an arc exists in the direct current grows, and the quantity of arc events is decreased by 1 when the possibility that an arc exists in the direct current reduces. A method for measuring the possibility that an arc exists in the direct current is provided. In addition, an operation of decreasing the quantity of arc events by 1 also avoids the following problem. The quantity of arc events is increased excessively fast, and therefore it is frequently determined that an arc exists in the direct current, and then device shutdown is frequently triggered.

In a possible implementation, when determining, when the counting result of the quantity of arc events meets the preset condition, that an arc exists in the direct current, the microprocessor is further configured to determine that an arc exists in the direct current when the counting result of the quantity of arc events is greater than or equal to a third threshold.

According to the foregoing solution, when the counting result of the quantity of arc events is greater than or equal to the third threshold, it is determined that an arc exists in the direct current, and a method for determining that an arc exists in the direct current is provided.

In a possible implementation, the microprocessor is further configured to set the quantity of arc events to the initial value when the counting result of the quantity of arc events is less than the initial value.

According to the foregoing solution, when the counting result of the quantity of arc events is less than the initial value, the quantity of arc events is set to the initial value in order to avoid a case in which the quantity of arc events is less than the initial value.

In a possible implementation, the first circuit includes a differentiating circuit, an amplification circuit, a hysteresis comparator circuit, an amplitude limiting circuit, and a waveform shaping circuit, where the differentiating circuit is configured to perform a differential operation on the input current sampling signal, output a first signal that has the change rate of the current sampling signal, and input the first signal to the amplification circuit, the amplification circuit is coupled to the differentiating circuit, and is configured to amplify an amplitude of the input first signal to specified times, output a second signal, and input the second signal to the hysteresis comparator circuit, the hysteresis comparator circuit is coupled to the amplification circuit, and is configured to process the second signal according to a first preset rule to obtain a third signal, and input the third signal to the amplitude limiting circuit, where the first preset rule includes outputting a forward pulse signal when an amplitude of the second signal is greater than or equal to a fourth threshold, and outputting a negative pulse signal when the amplitude of the second signal is less than the fourth threshold, the amplitude limiting circuit is coupled to the hysteresis comparator circuit, and is configured to process the third signal according to a second preset rule to obtain a fourth signal, and input the fourth signal to the waveform shaping circuit, where the second preset rule includes setting an amplitude of the negative pulse signal to zero, and setting an amplitude of the forward pulse signal to a fifth threshold when the amplitude of the forward pulse signal is greater than or equal to the fifth threshold, and keeping the amplitude of the forward pulse signal unchanged when the amplitude of the forward pulse signal is less than the fifth threshold, and the waveform shaping circuit is coupled to the amplitude limiting circuit, and is configured to output the time domain signal including the at least one pulse, and a width of each of the at least one pulse includes at least one time unit.

According to the foregoing solution, an implementation of the first circuit is provided.

According to a second aspect, an embodiment of the present disclosure provides a microprocessor provided in the first aspect, including a receiving module configured to receive a time domain signal output by a first circuit and a frequency domain signal output by a second circuit, a counting module configured to count a quantity of arc events based on results of analysis on the time domain signal and the frequency domain signal received by the receiving module, and a determining module configured to determine that an arc exists in a direct current when a counting result obtained by the counting module by counting the quantity of arc events meets a preset condition.

According to the foregoing solution, the receiving module receives the time domain signal output by the first circuit and the frequency domain signal output by the second circuit, the counting module counts the quantity of arc events based on the results of analysis on the time domain signal and the frequency domain signal, and when the counting result of the quantity of arc events meets the preset condition, the determining module determines that an arc exists in the direct current. Therefore, when analyzing the time domain signal, the counting module needs to consider whether a time domain change rate of a current sampling signal falls within an arc change rate range. Therefore, when the microprocessor provided in the second aspect detects whether an arc exists in the direct current, when an environmental factor causes a change of the current sampling signal, it is not considered by mistake that an arc exists in the direct current, thereby improving accuracy of a detection result of a circuit for arc detection in the direct current.

In a possible implementation, the microprocessor further includes a setting module configured to set the quantity of arc events to an initial value before the receiving module receives the time domain signal output by the first circuit and the frequency domain signal output by the second circuit, where when counting the quantity of arc events based on the results of analysis on the time domain signal and the frequency domain signal received by the receiving module, the counting module is further configured to analyze, in a specified sequence, one of at least one pulse included in the time domain signal, and if a width of the pulse is greater than or equal to a first threshold and the frequency domain signal has an arc characteristic, increase the quantity of arc events by 1, or otherwise, decrease the quantity of arc events by 1.

According to the foregoing solution, the counting module counts the quantity of arc events, and when a pulse width of a pulse is greater than or equal to the first threshold and the frequency domain signal has an arc characteristic, increases the quantity of arc events by 1, or otherwise, decreases the quantity of arc events by 1. Therefore, the counting module can measure, based on a value of the quantity of arc events, a possibility that an arc exists in the direct current. The quantity of arc events is increased by 1 when the possibility that an arc exists in the direct current grows, and the quantity of arc events is decreased by 1 when the possibility that an arc exists in the direct current reduces. A method for measuring the possibility that an arc exists in the direct current is provided. In addition, an operation of decreasing the quantity of arc events by 1 also avoids the following problem. The quantity of arc events is increased excessively fast, and therefore it is frequently determined that an arc exists in the direct current, and then device shutdown is frequently triggered.

In a possible implementation, the microprocessor further includes a setting module configured to set the quantity of arc events to an initial value before the receiving module receives the time domain signal output by the first circuit and the frequency domain signal output by the second circuit, where when counting the quantity of arc events based on the results of analysis on the time domain signal and the frequency domain signal received by the receiving module, the counting module is further configured to, if a width of any one of at least one pulse included in the time domain signal is greater than or equal to a second threshold and the frequency domain signal has an arc characteristic, increase the quantity of arc events by 1, or otherwise, decrease the quantity of arc events by 1, if a width of each of at least one pulse included in the time domain signal is greater than or equal to a second threshold and the frequency domain signal has an arc characteristic, increase the quantity of arc events by 1, or otherwise, decrease the quantity of arc events by 1.

According to the foregoing solution, the counting module counts the quantity of arc events, and when a width of any one of the at least one pulse is greater than or equal to the second threshold or the width of each of the at least one pulse is greater than or equal to the second threshold, and the frequency domain signal has an arc characteristic, increases the quantity of arc events by 1, or otherwise, decreases the quantity of arc events by 1. Therefore, a possibility that an arc exists in the direct current can be measured based on a value of the quantity of arc events. The quantity of arc events is increased by 1 when the possibility that an arc exists in the direct current grows, and the quantity of arc events is decreased by 1 when the possibility that an arc exists in the direct current reduces. A method for measuring the possibility that an arc exists in the direct current is provided. In addition, an operation of decreasing the quantity of arc events by 1 also avoids the following problem. The quantity of arc events is increased excessively fast, and therefore it is frequently determined that an arc exists in the direct current, and then device shutdown is frequently triggered.

In a possible implementation, when determining, when the counting result obtained by the counting module by counting the quantity of arc events meets the preset condition, that an arc exists in the direct current, the determining module is further configured to determine that an arc exists in the direct current when the counting result obtained by the counting module by counting the quantity of arc events is greater than or equal to a third threshold.

According to the foregoing solution, when the counting result of the quantity of arc events is greater than or equal to the third threshold, the determining module determines that an arc exists in the direct current, and a method for determining that an arc exists in the direct current is provided for the determining module.

In a possible implementation, the setting module is further configured to set the quantity of arc events to the initial value when the counting result obtained by the counting module by counting the quantity of arc events is less than the initial value.

According to the foregoing solution, when the counting result of the quantity of arc events is less than the initial value, the setting module sets the quantity of arc events to the initial value in order to avoid a case in which the quantity of arc events is less than the initial value.

DESCRIPTION OF EMBODIMENTS

To make the objectives, solutions, and advantages of the embodiments of the present disclosure more understandable, the following provides detailed descriptions. The detailed descriptions provide various implementations of an apparatus and/or a method using block diagrams, flowcharts, and/or examples. These block diagrams, flowcharts, and/or examples include one or more functions and/or operations. Persons skilled in the art may understand that each function and/or operation in the block diagrams, the flowcharts, or the examples can be performed independently or jointly using various hardware, software, and firmware, or any combination thereof.

Figure 1:
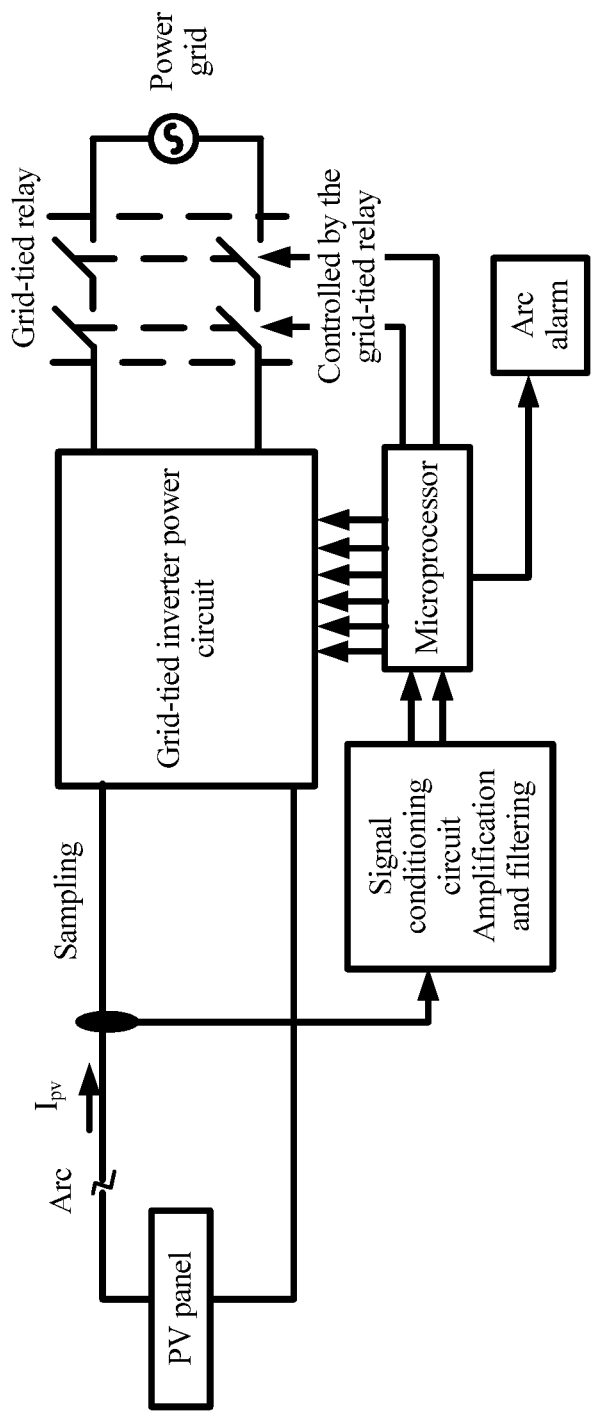
FIG. 1 is a schematic structural diagram of a circuit for arc detection in a direct current applied to a PV power system.

FIG. 1 may be a schematic structural diagram of a circuit for arc detection in a direct current applied to a PV power system. A method in which the circuit for arc detection in the direct current detects whether an arc exists in a direct current generated by a PV panel may be as follows. A current sampling signal of a direct current $I_{pv}$ is obtained by sampling the direct current, and then is amplified and filtered by a signal conditioning circuit for analysis by a microprocessor, and the microprocessor performs frequency domain analysis and time domain analysis on a signal obtained after processing by the signal conditioning circuit. When an arc exists in a direct current, the direct current has some frequency domain characteristics and time domain characteristics, for example, a high frequency component increase and a frequency lower limit increase in frequency domain, and a ripple increase and a sudden amplitude change in time domain. Therefore, it can be determined, by performing frequency domain analysis and time domain analysis on the direct current $I_{pv}$, whether an arc exists in the direct current $I_{pv}$. If an arc exists in the direct current $I_{pv}$, the microprocessor sends an alarm indication and a grid-tied inverter shutdown command. In this case, both a grid-tied inverter and a grid-tied relay are disconnected, a loop of the direct current $I_{pv}$ is disconnected after the grid-tied inverter is separated from a power grid, and the arc is extinguished.

The PV panel in the PV power system is greatly affected by an environment, and a change of sun radiation or temperature causes a sudden change of output power of the PV panel, and further causes a sudden change of the direct current $I_{pv}$. Therefore, when detecting whether an arc exists in the direct current, the detection circuit shown in FIG. 1 may determine the sudden change of the direct current $I_{pv}$ caused by a change of an environmental factor such as sun radiation or temperature as an arc characteristic, resulting in reduced accuracy of a detection result of the detection circuit.

The embodiments of the present disclosure provide a circuit for arc detection in a direct current and a microprocessor in order to resolve a problem of low accuracy of a detection result of an existing circuit for arc detection in a direct current. In the embodiments of the present disclosure, the circuit for arc detection in the direct current includes a current sampling circuit, a first circuit, a second circuit, and a microprocessor. The current sampling circuit is configured to perform current sampling on the direct current, and output a current sampling signal of the direct current. The first circuit is configured to receive the current sampling signal and output, after processing the current sampling signal, a time domain signal including at least one pulse, where the at least one pulse is used to indicate a time domain change rate of the current sampling signal. The second circuit is configured to receive the current sampling signal, and output a frequency domain signal of the current sampling signal after amplifying and filtering the current sampling signal. The microprocessor is configured to receive the time domain signal output by the first circuit and the frequency domain signal output by the second circuit, count a quantity of arc events based on results of analysis on the time domain signal and the frequency domain signal, and when a counting result of the quantity of arc events meets a preset condition, determine that an arc exists in the direct current.

Because the at least one pulse in the time domain signal reflects the time domain change rate of the current sampling signal, when analyzing the time domain signal, the microprocessor needs to consider whether the time domain change rate of the current sampling signal falls within an arc change rate range. Therefore, according to the technical solutions provided in the embodiments of the present disclosure, when an environmental factor causes a change of the current sampling signal, it is not considered by mistake that an arc exists in the direct current, thereby improving accuracy of a detection result of the circuit for arc detection in the direct current.

The following describes in detail a circuit for arc detection in a direct current and a microprocessor provided in the embodiments of the present disclosure. It should be noted that a presentation sequence of the embodiments of the present disclosure merely represents a sequence of the embodiments, and does not represent priorities of the technical solutions provided in the embodiments.

Embodiment 1

Figure 2:
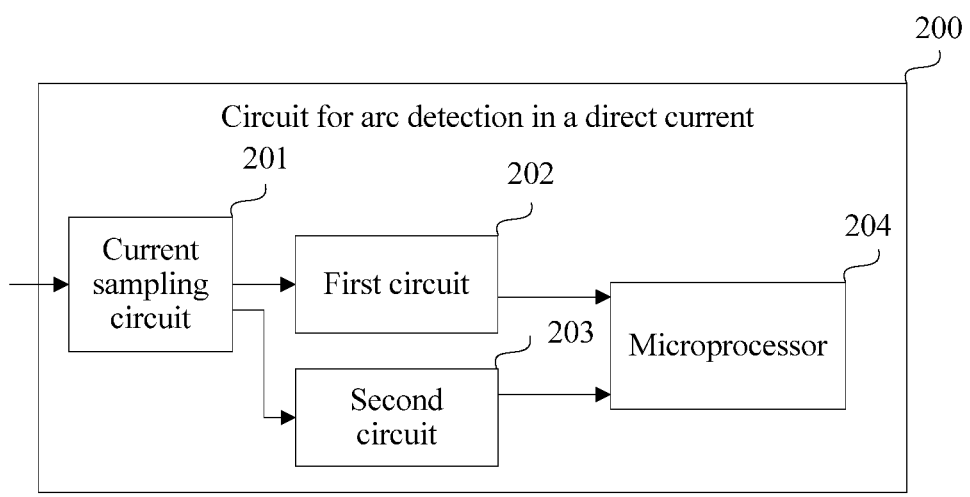
FIG. 2 is a schematic structural diagram of a circuit for arc detection in a direct current according to an embodiment of the present disclosure.

This embodiment of the present disclosure provides a circuit for arc detection in a direct current. As shown in FIG. 2, the circuit 200 for arc detection in the direct current includes a current sampling circuit 201, a first circuit 202, a second circuit 203, and a microprocessor 204.

The current sampling circuit 201 is configured to perform current sampling on the direct current, and output a current sampling signal of the direct current.

The first circuit 202 is configured to receive the current sampling signal output by the current sampling circuit 201, and output a time domain signal after processing the current sampling signal, where the time domain signal includes at least one pulse, and the at least one pulse is used to indicate a time domain change rate of the current sampling signal.

The second circuit 203 is configured to receive the current sampling signal output by the current sampling circuit 201, and output a frequency domain signal of the current sampling signal after amplifying and filtering the current sampling signal.

The microprocessor 204 is configured to receive the time domain signal output by the first circuit 202 and the frequency domain signal output by the second circuit 203, count a quantity of arc events based on results of analysis on the time domain signal and the frequency domain signal, and determine that an arc exists in the direct current when a counting result of the quantity of arc events meets a preset condition.

The following describes in detail an implementation and a function of each circuit in the circuit 200 for arc detection in the direct current.

1. Current Sampling Circuit 201.

The current sampling circuit 201 may be implemented using a current transformer, and the current sampling signal output by the current sampling circuit 201 is an analog signal.

2. First Circuit 202.

A specific implementation of the first circuit 202 and a function of each part of the first circuit 202 are to be described in detail in Embodiment 2, and details are not described herein.

3. Second Circuit 203.

The second circuit 203 may be a signal conditioning circuit. In the signal conditioning circuit, a high order filter may be selected as a filter. The high order filter has a relatively good frequency selection feature and can filter out noise in the current sampling signal.

The frequency domain signal output by the second circuit 203 is a signal used for performing frequency domain analysis on the direct current, and the frequency domain signal may be an analog signal or may be a digital signal.

When the frequency domain signal is a digital signal, a circuit configured to convert an analog signal into a digital signal needs to be disposed in the second circuit 203. When the frequency domain signal is an analog signal, after the second circuit 203 outputs the frequency domain signal, the analog signal, namely, the frequency domain signal needs to be converted into a digital signal.

4. Microprocessor 204.

By counting the quantity of arc events, the microprocessor 204 can update the quantity of arc events in order to learn of a possibility that an arc exists in the direct current. When the counting result of the quantity of arc events meets the preset condition, the microprocessor 204 determines that an arc exists in the direct current.

The quantity of arc events is used to indicate the possibility that an arc exists in the direct current, and a larger quantity of arc events indicates a higher possibility that an arc exists in the direct current.

For example, when the possibility that an arc exists in the direct current grows, the quantity of arc events may be increased by 1, and when the possibility that an arc exists in the direct current reduces, the quantity of arc events may be decreased by 1.

After the microprocessor 204 determines that an arc exists in the direct current, related measures in the other approaches may be taken to extinguish the arc. For example, in a PV power system, after determining that an arc exists in the direct current, the microprocessor 204 may trigger an arc alarm, and then trigger a grid-tied inverter shutdown command. In this case, both a grid-tied inverter and a grid-tied relay are disconnected, and the arc in the direct current is extinguished.

Optionally, the microprocessor 204 is further configured to set the quantity of arc events to an initial value before receiving the time domain signal output by the first circuit 202 and the frequency domain signal output by the second circuit 203, and when counting the quantity of arc events based on the results of analysis on the time domain signal and the frequency domain signal, the microprocessor 204 is further configured to analyze, in a specified sequence, one of the at least one pulse included in the time domain signal, and if a width of the pulse is greater than or equal to a first threshold and the frequency domain signal has an arc characteristic, increase the quantity of arc events by 1, or otherwise, decrease the quantity of arc events by 1.

The initial value that is set for the quantity of arc events may be zero.

It should be noted that alternatively, the initial value that is set for the quantity of arc events may be another value, and values are not enumerated herein.

The specified sequence may be a sequence in which occurring time of the at least one pulse is arranged in ascending order, or may be a sequence in which occurring time of the at least one pulse is arranged in descending order. The specified sequence is not limited in this embodiment of the present disclosure.

The first threshold may be set using experimental data and the like. For example, the first threshold may be set to 200 microseconds.

A method for determining whether the frequency domain signal has an arc characteristic may include after fast Fourier transform is performed on the frequency domain signal, determining whether a high frequency component of the frequency domain signal is increased, or determining whether a frequency lower limit of the frequency domain signal is increased. The method for determining whether the frequency domain signal has an arc characteristic may be performed according to the other approaches, and details are not described herein.

The quantity of arc events is decreased by 1 for the following reason. When an arc exists in the direct current, the arc may be extinguished by itself. When a width of a pulse is less than the first threshold and/or the frequency domain signal does not have an arc characteristic, it may indicate that an arc is extinguished by itself after the arc is generated in the direct current. In this case, it may be considered that a previous arc causing the quantity of arc events to be increased by 1 has been extinguished, and therefore the quantity of arc events can be decreased by 1.

The quantity of arc events is decreased by 1 such that the following problem is avoided. The quantity of arc events is increased excessively fast, and therefore it is frequently determined that an arc exists in the direct current, and then device shutdown is frequently triggered.

Optionally, the microprocessor 204 is further configured to set the quantity of arc events to an initial value before receiving the time domain signal output by the first circuit 202 and the frequency domain signal output by the second circuit 203.

When counting the quantity of arc events based on the results of analysis on the time domain signal and the frequency domain signal, the microprocessor 204 is further configured to, if a width of any one of the at least one pulse included in the time domain signal is greater than or equal to a second threshold and the frequency domain signal has an arc characteristic, increase the quantity of arc events by 1, or otherwise, decrease the quantity of arc events by 1, if a width of each of the at least one pulse included in the time domain signal is greater than or equal to a second threshold and the frequency domain signal has an arc characteristic, increase the quantity of arc events by 1, or otherwise, decrease the quantity of arc events by 1.

The initial value that is set for the quantity of arc events may be zero.

It should be noted that alternatively, the initial value that is set for the quantity of arc events may be another value, and values are not enumerated herein.

The second threshold may be set using experimental data and the like. For example, the second threshold may be set to 200 microseconds. The second threshold may have a same value as the first threshold, or may have a different value from the first threshold.

A method in which the microprocessor 204 determines whether the frequency domain signal has an arc characteristic may include after fast Fourier transform is performed on the frequency domain signal, determining whether a high frequency component of the frequency domain signal is increased, or determining whether a frequency lower limit of the frequency domain signal is increased. The method for determining whether the frequency domain signal has an arc characteristic may be performed according to the other approaches, and details are not described herein.

When there is not a pulse whose width is greater than or equal to the second threshold in the at least one pulse included in the time domain signal and/or the frequency domain signal does not have an arc characteristic, the microprocessor decreases the quantity of arc events by 1 for the following reason. When an arc exists in the direct current, the arc may be extinguished by itself. When there is not a pulse whose width is greater than or equal to the second threshold in the at least one pulse included in the time domain signal and/or the frequency domain signal does not have an arc characteristic, it may indicate that an arc is extinguished by itself after the arc is generated in the direct current. In this case, it may be considered that a previous arc causing the quantity of arc events to be increased by 1 has been extinguished, and therefore the quantity of arc events can be decreased by 1. In this way, the following problem is avoided. The quantity of arc events is increased excessively fast, and therefore it is frequently determined that an arc exists in the direct current, and then device shutdown is frequently triggered.

When there is a pulse whose width is less than the second threshold in the at least one pulse included in the time domain signal and/or the frequency domain signal does not have an arc characteristic, the microprocessor decreases the quantity of arc events by 1 for the following reason. When an arc exists in the direct current, the arc may be extinguished by itself. When there is a pulse whose width is less than the second threshold in the at least one pulse included in the time domain signal and/or the frequency domain signal does not have an arc characteristic, it may indicate that an arc is extinguished by itself after the arc is generated in the direct current. In this case, it may be considered that a previous arc causing the quantity of arc events to be increased by 1 has been extinguished, and therefore the microprocessor can decrease the quantity of arc events by 1. In this way, the following problem is avoided. The quantity of arc events is increased excessively fast, and therefore it is frequently determined that an arc exists in the direct current, and then device shutdown is frequently triggered.

In the foregoing two manners of decreasing the quantity of arc events by 1, the time domain signal is used as a whole. A conclusion as to whether the time domain signal has an arc characteristic is obtained in its entirety by determining a width of the at least one pulse included in the time domain signal. After the time domain signal is determined once, the quantity of arc events is increased or decreased by 1 only once.

The foregoing two manners differ only in a determining condition for determining the time domain signal. To be specific, in one manner, when a width of any one of the at least one pulse included in the time domain signal is greater than or equal to the second threshold, it is considered that the time domain signal has an arc characteristic. In the other manner, only when a width of each of the at least one pulse included in the time domain signal is greater than or equal to the second threshold, it is considered that the time domain signal has an arc characteristic.

The quantity of arc events is decreased by 1 such that the following problem is avoided. The quantity of arc events is increased excessively fast, and therefore it is frequently determined that an arc exists in the direct current, and then device shutdown is frequently triggered.

Optionally, when determining, when the counting result of the quantity of arc events meets the preset condition, that an arc exists in the direct current, the microprocessor 204 is further configured to determine that an arc exists in the direct current when the counting result of the quantity of arc events is greater than or equal to a third threshold.

The third threshold may be set using experimental data and the like. For example, the third threshold may be set to 10.

When the counting result of the quantity of arc events is greater than or equal to the third threshold, the microprocessor 204 determines, for the following reason, that an arc exists in the direct current. The microprocessor 204 triggers an arc alarm after determining that an arc exists in a direct current of a device, and consequently the device shuts down. After the device shuts down, the device needs to be started up manually. If the microprocessor 204 frequently triggers the arc alarm, the device shuts down and is started up frequently. Therefore, only when the counting result of the quantity of arc events reaches the third threshold, it is determined that an arc exists in the direct current. In this way, the following problem is avoided. The quantity of arc events is increased excessively fast, and therefore it is frequently determined that an arc exists in the direct current, and then device shutdown is frequently triggered.

Optionally, the microprocessor 204 is further configured to set the quantity of arc events to the initial value when the counting result of the quantity of arc events is less than the initial value.

When counting the quantity of arc events, the microprocessor 204 may decrease the quantity of arc events by 1, and therefore the quantity of arc events may be less than the initial value. In practice, it is impossible that the quantity of arc events is less than the initial value. Therefore, when the counting result of the quantity of arc events is less than the initial value, the quantity of arc events is set to the initial value in order to avoid reduced accuracy of the method for arc detection in the direct current that is caused when the quantity of arc events is less than the initial value.

The circuit 200 for arc detection in the direct current provided in Embodiment 1 of the present disclosure may be applied to an electrical system, for example, a PV power system.

Figure 3:
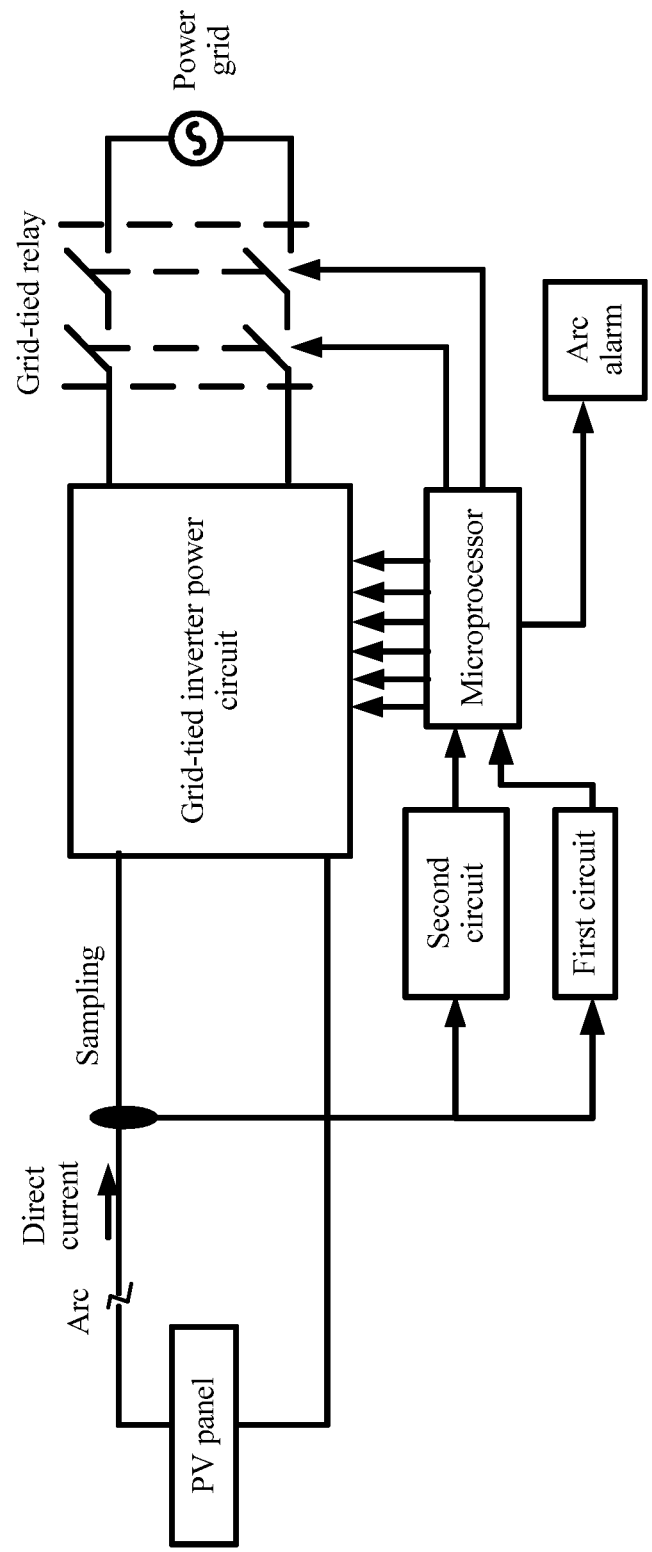
FIG. 3 is a schematic structural diagram of a first circuit according to an embodiment of the present disclosure.

When the circuit 200 for arc detection in the direct current provided in Embodiment 1 of the present disclosure is applied to the PV power system, the PV power system may be shown in FIG. 3.

In FIG. 3, a sampling operation on a direct current may be implemented using the current sampling circuit 201 in Embodiment 1, a first circuit may be the first circuit 202 in Embodiment 1, a second circuit may be the second circuit 203 in Embodiment 1, and a microprocessor may be the microprocessor 204 in Embodiment 1.

In FIG. 3, a current sampling signal of the direct current is obtained after the direct current is sampled. After the current sampling signal is input to the first circuit, the first circuit outputs a time domain signal including at least one pulse, where the at least one pulse is used to indicate a time domain change rate of the current sampling signal. After the current sampling signal is input to the second circuit, the second circuit outputs a frequency domain signal of the current sampling signal. The microprocessor counts a quantity of arc events based on results of analysis on the time domain signal and the frequency domain signal, and when a counting result of the quantity of arc events meets a preset condition, determines that an arc exists in the direct current.

In Embodiment 1, the circuit for arc detection in the direct current includes the current sampling circuit, the first circuit, the second circuit, and the microprocessor. The current sampling circuit is configured to perform current sampling on the direct current, and output the current sampling signal of the direct current. The first circuit is configured to receive the current sampling signal and output, after processing the current sampling signal, the time domain signal including the at least one pulse, where the at least one pulse is used to indicate the time domain change rate of the current sampling signal. The second circuit is configured to receive the current sampling signal, and output the frequency domain signal of the current sampling signal after amplifying and filtering the current sampling signal. The microprocessor is configured to receive the time domain signal output by the first circuit and the frequency domain signal output by the second circuit, count the quantity of arc events based on the results of analysis on the time domain signal and the frequency domain signal, and determine that an arc exists in the direct current when the counting result of the quantity of arc events meets the preset condition.

Because the at least one pulse in the time domain signal reflects the time domain change rate of the current sampling signal, when analyzing the time domain signal, the microprocessor needs to consider whether the time domain change rate of the current sampling signal falls within an arc change rate range. Therefore, according to the technical solution provided in Embodiment 1 of the present disclosure, when an environmental factor causes a change of the current sampling signal, it is not considered by mistake that an arc exists in the direct current, thereby improving accuracy of arc detection in the direct current.

Embodiment 2

Figure 4:
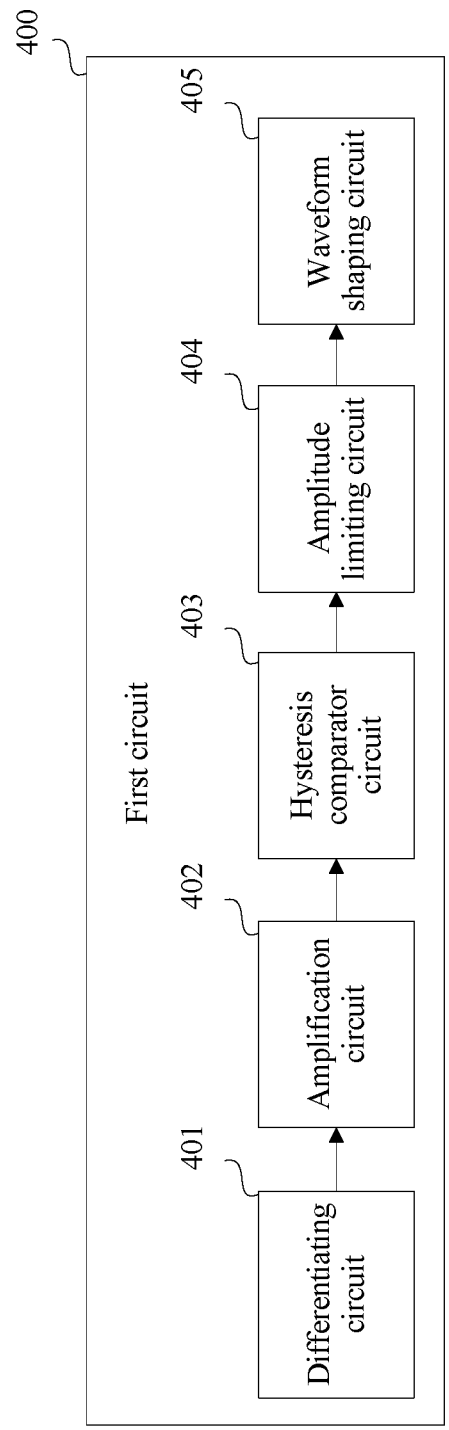
FIG. 4 is a schematic structural diagram of another first circuit according to an embodiment of the present disclosure.

This embodiment of the present disclosure further provides a first circuit, and the first circuit provided in this embodiment of the present disclosure may be shown in FIG. 4. The first circuit 400 may be applied to the circuit 200 for arc detection in the direct current provided in Embodiment 1. That is, the first circuit 400 in FIG. 4 is a possible implementation of the first circuit 202 in Embodiment 1.

As shown in FIG. 4, the first circuit 400 includes a differentiating circuit 401, an amplification circuit 402, a hysteresis comparator circuit 403, an amplitude limiting circuit 404, and a waveform shaping circuit 405, where the differentiating circuit 401 is configured to perform a differential operation on an input current sampling signal, output a first signal that has a change rate of the current sampling signal, and input the first signal to the amplification circuit, the amplification circuit 402 is coupled to the differentiating circuit 401, and is configured to amplify an amplitude of the input first signal to specified times, output a second signal, and input the second signal to the hysteresis comparator circuit 403, the hysteresis comparator circuit 403 is coupled to the amplification circuit 402, and is configured to process the second signal according to a first preset rule to obtain a third signal, and input the third signal to the amplitude limiting circuit 404, where the first preset rule includes outputting a forward pulse signal when an amplitude of the second signal is greater than or equal to a fourth threshold, and outputting a negative pulse signal when the amplitude of the second signal is less than the fourth threshold, the amplitude limiting circuit 404 is coupled to the hysteresis comparator circuit 403, and is configured to process the third signal according to a second preset rule to obtain a fourth signal, and input the fourth signal to the waveform shaping circuit 405, where the second preset rule includes setting an amplitude of the negative pulse signal to zero, and setting an amplitude of the forward pulse signal to a fifth threshold when the amplitude of the forward pulse signal is greater than or equal to the fifth threshold, and keeping the amplitude of the forward pulse signal unchanged when the amplitude of the forward pulse signal is less than the fifth threshold, and the waveform shaping circuit 405 is coupled to the amplitude limiting circuit 404, and is configured to output a time domain signal including at least one pulse, and a width of each of the at least one pulse includes at least one time unit.

The at least one time unit is determined by a resistor and a capacitor that are externally connected to a monostable trigger in the waveform shaping circuit 405. For example, the time unit may be one microsecond. It should be noted that alternatively, the time unit may be another value, and values are not enumerated herein.

Optionally, the differentiating circuit 401 includes at least one resistor, at least one capacitor, and a first operational amplifier.

Optionally, the amplification circuit 402 includes at least one resistor, at least one capacitor, and a second operational amplifier.

Optionally, the hysteresis comparator circuit 403 includes at least one resistor and a third operational amplifier.

Optionally, the amplitude limiting circuit 404 includes at least one Zener diode.

Optionally, the waveform shaping circuit 405 includes at least one resistor, at least one capacitor, and the monostable trigger.

Figure 5:
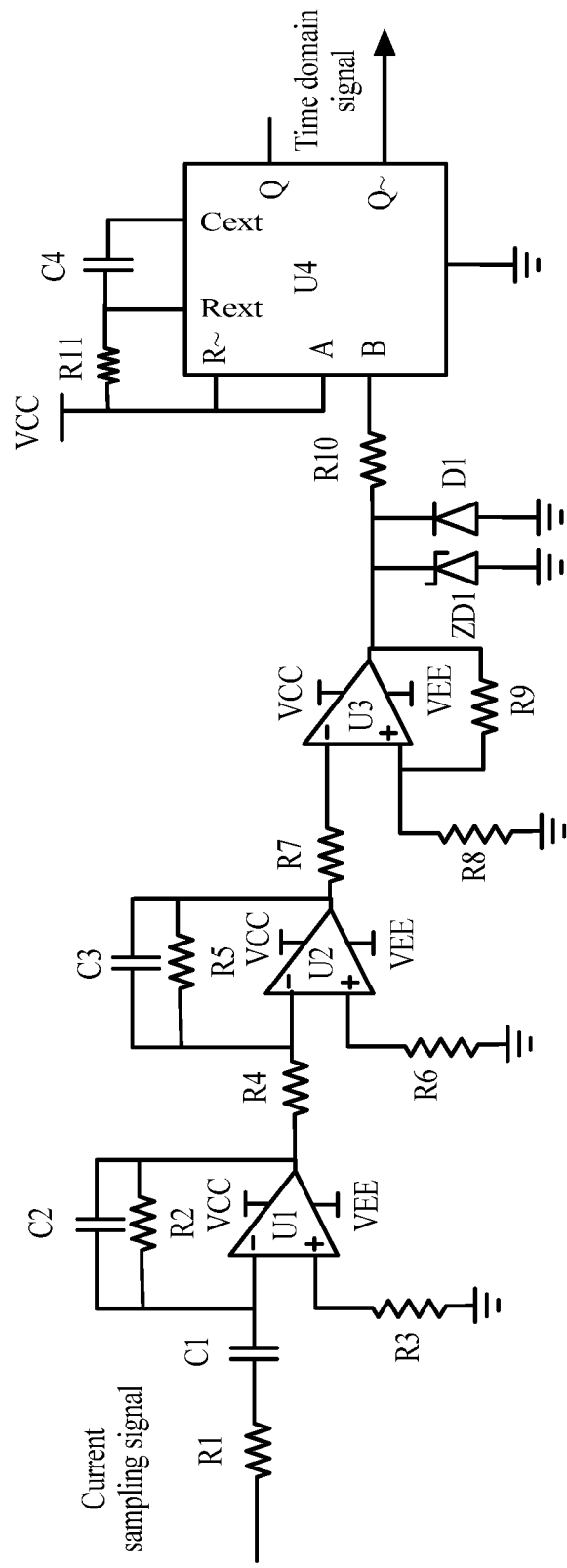
FIG. 5 is a schematic structural diagram of a PV power system in which a circuit for arc detection in a direct current performs arc detection according to an embodiment of the present disclosure.

FIG. 5 shows an example of the first circuit shown in FIG. 4. In FIG. 5, a resistor R1, a resistor R2, a resistor R3, a capacitor C1, a capacitor C2, and an operational amplifier U1 are included in the differentiating circuit 401 in FIG. 4, a resistor R4, a resistor R5, a resistor R6, a capacitor C3, and an operational amplifier U2 are included in the amplification circuit 402 in FIG. 4, a resistor R7, a resistor R8, a resistor R9, and a comparator U3 are included in the hysteresis comparator circuit 403 in FIG. 4, a Zener diode ZD1 is included in the amplitude limiting circuit 404 in FIG. 4, a Schmidt trigger U4, a resistor R10, a resistor R11, and a capacitor C4 are included in the waveform shaping circuit 405 in FIG. 4.

A diode D1 is coupled between the amplitude limiting circuit 404 and the waveform shaping circuit 405, and a function of the diode D1 is to prevent a signal input to the Schmidt trigger U4 in the waveform shaping circuit 405 from being negative.

The current sampling signal of the direct current is output to the input end R1 of the differentiating circuit. When the direct current changes, the differentiating circuit can obtain the change rate of the direct current through sampling, and output the change rate to the next-level amplification circuit. The amplification circuit amplifies the change rate obtained by the differentiating circuit through sampling to a suitable range, for example, amplifies the change rate to a range in which the next-level hysteresis comparator circuit can be driven. If the change rate of the direct current exceeds the fourth threshold that is set in the hysteresis comparator circuit, the hysteresis comparator circuit outputs a pulse signal. After the amplitude limiting circuit performs amplitude limiting on the pulse signal, a bipolar pulse is converted into a unipolar pulse, and the unipolar pulse triggers the next-level waveform shaping circuit. The Schmidt trigger U4 outputs the time domain signal including the at least one pulse, and the width of each of the at least one pulse includes the at least one time unit.

The time unit is calculated by the resistor R11 and the capacitor C4 in the waveform shaping circuit. For example, the time unit may be one microsecond. It should be noted that alternatively, the time unit may be another value, and values are not enumerated herein.

Embodiment 3

Figure 6:
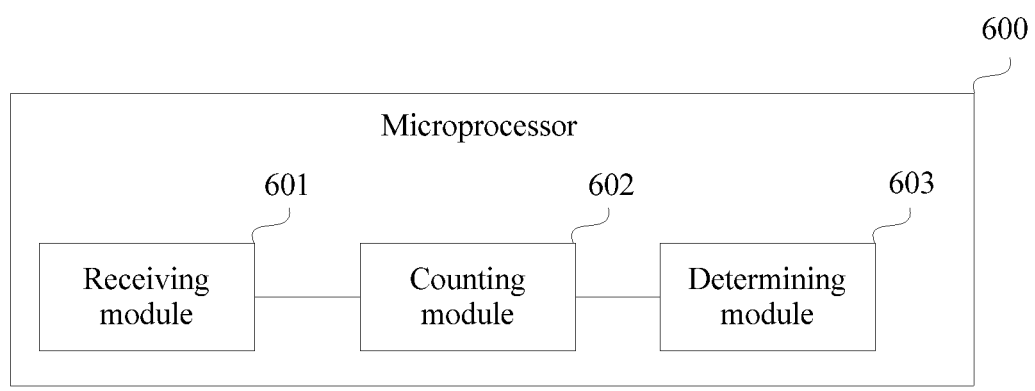
FIG. 6 is a schematic structural diagram of a microprocessor according to an embodiment of the present disclosure.

This embodiment of the present disclosure further provides a microprocessor, namely, a microprocessor 600 shown in FIG. 6. The microprocessor 600 may be applied to Embodiment 1, i.e., the microprocessor 600 is a possible implementation of the microprocessor 204 in Embodiment 1. As shown in FIG. 6, the microprocessor 600 includes a receiving module 601 configured to receive a time domain signal output by a first circuit and a frequency domain signal output by a second circuit, a counting module 602 configured to count a quantity of arc events based on results of analysis on the time domain signal and the frequency domain signal received by the receiving module 601, and a determining module 603 configured to when a counting result obtained by the counting module 602 by counting the quantity of arc events meets a preset condition, determine that an arc exists in a direct current.

Optionally, the microprocessor 600 further includes a setting module (not shown) configured to set the quantity of arc events to an initial value before the receiving module 601 receives the time domain signal output by the first circuit and the frequency domain signal output by the second circuit, where when counting the quantity of arc events based on the results of analysis on the time domain signal and the frequency domain signal received by the receiving module 601, the counting module 602 is further configured to analyze, in a specified sequence, one of at least one pulse included in the time domain signal, and if a width of the pulse is greater than or equal to a first threshold and the frequency domain signal has an arc characteristic, increase the quantity of arc events by 1, or otherwise, decrease the quantity of arc events by 1.

Optionally, the microprocessor 600 further includes a setting module (not shown) configured to set the quantity of arc events to an initial value before the receiving module 601 receives the time domain signal output by the first circuit and the frequency domain signal output by the second circuit, where when counting the quantity of arc events based on the results of analysis on the time domain signal and the frequency domain signal received by the receiving module 601, the counting module 602 is further configured to, if a width of any one of at least one pulse included in the time domain signal is greater than or equal to a second threshold and the frequency domain signal has an arc characteristic, increase the quantity of arc events by 1, or otherwise, decrease the quantity of arc events by 1, or if a width of each of at least one pulse included in the time domain signal is greater than or equal to a second threshold and the frequency domain signal has an arc characteristic, increase the quantity of arc events by 1, or otherwise, decrease the quantity of arc events by 1.

The setting module may be the same as the setting module in the foregoing optional implementation of Embodiment 3.

Optionally, when determining, when the counting result obtained by the counting module 602 by counting the quantity of arc events meets the preset condition, that an arc exists in the direct current, the determining module 603 is further configured to, when the counting result obtained by the counting module 602 by counting the quantity of arc events is greater than or equal to a third threshold, determine that an arc exists in the direct current.

Optionally, the setting module is further configured to set the quantity of arc events to the initial value when the counting result obtained by the counting module 602 by counting the quantity of arc events is less than the initial value.

Embodiment 4

Figure 7A:
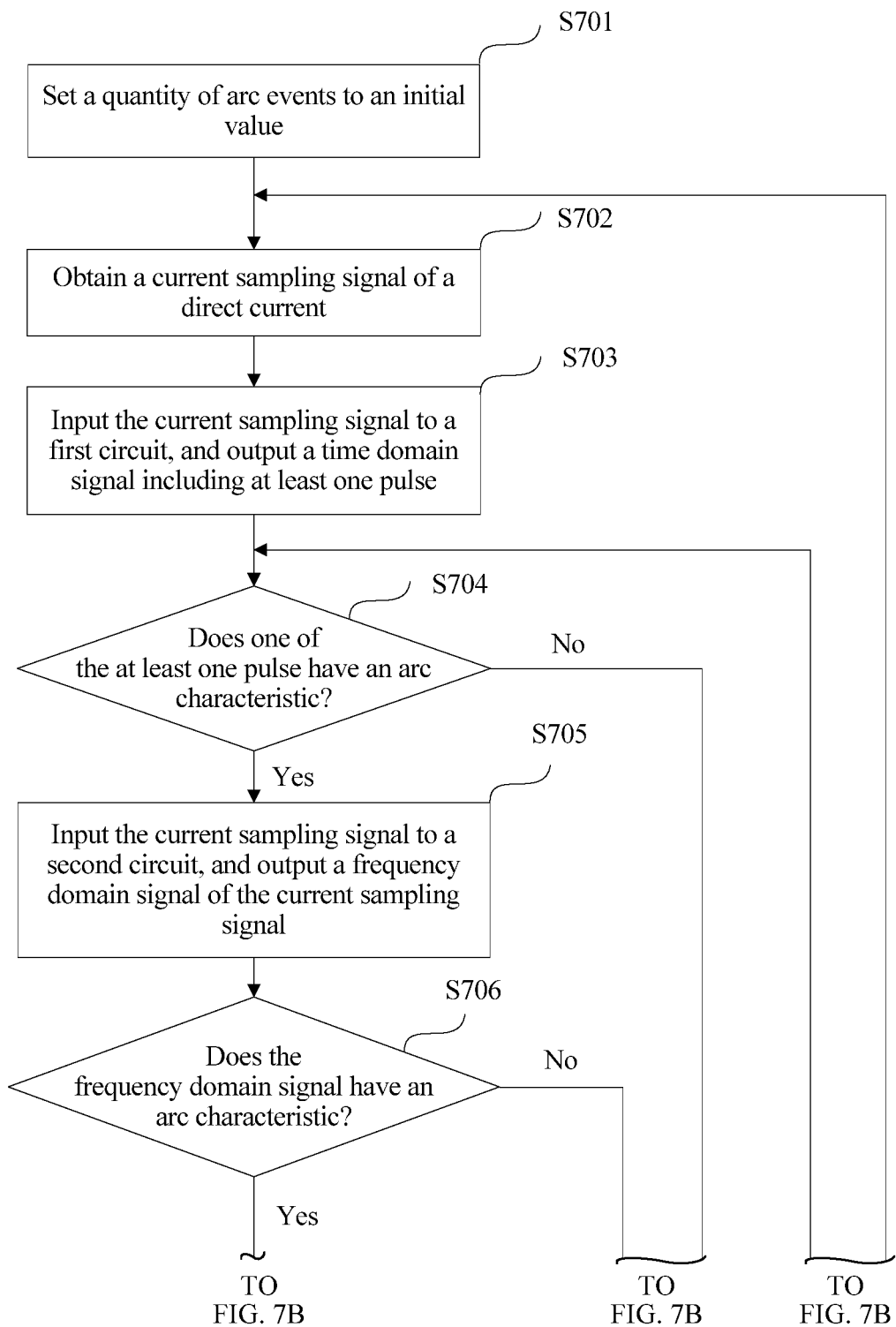
FIG. 7A and FIG. 7B are a schematic flowchart of a method for arc detection in a direct current according to an embodiment of the present disclosure.
Figure 7B:
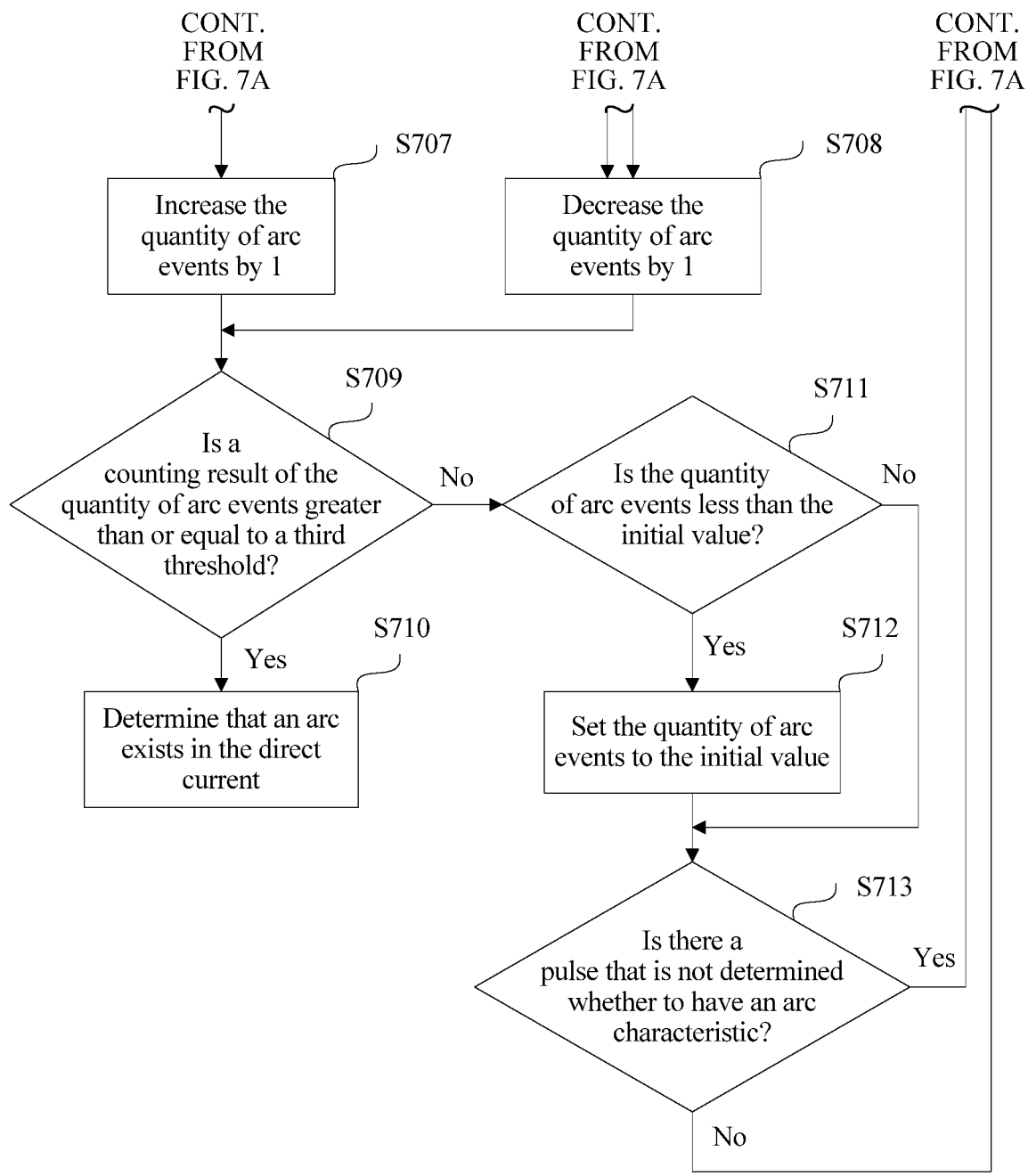

This embodiment of the present disclosure further provides a method for arc detection in a direct current. The method may be applied to the circuit 200 for arc detection in the direct current provided in Embodiment 1. As shown in FIG. 7A and FIG. 7B, the method includes the following steps.

Step S701. Set a quantity of arc events to an initial value.

The quantity of arc events is used to indicate whether an arc exists in a direct current, the arc event may indicate a possibility that an arc exists in the direct current, and a larger quantity of arc events indicates a higher possibility that an arc exists in the direct current.

For example, the initial value that is set for the quantity of arc events may be zero.

It should be noted that alternatively, the initial value that is set for the quantity of arc events may be another value, and values are not enumerated herein.

Step S702. Obtain a current sampling signal of a direct current.

The current sampling signal is an analog signal, and the current sampling signal may be obtained by disposing the current sampling circuit 201 in Embodiment 1 on a direct current line on which the direct current is located.

Step S703. Input the current sampling signal to a first circuit, and output a time domain signal including at least one pulse.

In step S703, the at least one pulse included in the time domain signal is used to indicate a time domain change rate of the current sampling signal, and the time domain signal is used to determine whether the direct current has an arc characteristic in time domain.

Step S704. Determine, in a specified sequence, whether one of the at least one pulse has an arc characteristic, and if one of the at least one pulse has an arc characteristic, perform step S705, or if none of the at least one pulse has an arc characteristic, perform step S708.

It should be noted that the specified sequence may be a sequence in which occurring time of the at least one pulse is arranged in ascending order, or may be a sequence in which occurring time of the at least one pulse is arranged in descending order. The specified sequence is not limited in this embodiment of the present disclosure.

A method for determining that a pulse has an arc characteristic may include when a width of the pulse is greater than or equal to a first threshold, determining that the pulse has an arc characteristic.

The first threshold may be set using experimental data and the like. For example, the first threshold may be set to 200 microseconds.

Step S705. Input the current sampling signal to a second circuit, and output a frequency domain signal of the current sampling signal.

In step S705, the second circuit may be a signal conditioning circuit, and the signal conditioning circuit amplifies and filters the current sampling signal, and outputs the frequency domain signal of the current sampling signal.

In the signal conditioning circuit, a high order filter may be selected as a filter. The high order filter has a relatively good frequency selection feature and can filter out noise in the current sampling signal.

In step S705, the frequency domain signal is a signal used for performing frequency domain analysis on the direct current, and the frequency domain signal may be an analog signal or may be a digital signal.

When the frequency domain signal is a digital signal, a circuit configured to convert an analog signal into a digital signal needs to be disposed in the second circuit. When the frequency domain signal is an analog signal, a circuit configured to convert an analog signal into a digital signal needs to be disposed in a microprocessor.

Step S706. Determine whether the frequency domain signal has an arc characteristic, and if the frequency domain signal has an arc characteristic, perform step S707, or if the frequency domain signal does not have an arc characteristic, perform step S708.

A method for determining whether the frequency domain signal has an arc characteristic may include after fast Fourier transform is performed on the frequency domain signal, determining whether a high frequency component of the frequency domain signal is increased, or determining whether a frequency lower limit of the frequency domain signal is increased. The method for determining whether the frequency domain signal has an arc characteristic may be performed according to the other approaches, and details are not described herein.

In a process shown in FIG. 7A and FIG. 7B, an example is described in which it is first determined whether one of the at least one pulse has an arc characteristic and then it is determined whether the frequency domain signal has an arc characteristic. In practice, it may be first determined whether the frequency domain signal has an arc characteristic and then it is determined whether one of the at least one pulse has an arc characteristic. A determining sequence is not limited in this embodiment of the present disclosure.

Step S707. Increase the quantity of arc events by 1.

Increasing the quantity of arc events by 1 indicates that the possibility that an arc exists in the direct current grows.

Step S708. Decrease the quantity of arc events by 1.

Decreasing the quantity of arc events by 1 indicates that the possibility that an arc exists in the direct current reduces.

Step S708 is set for the following purpose. When an arc exists in the direct current, the arc may be extinguished by itself. When one of the at least one pulse does not have an arc characteristic and/or the frequency domain signal does not have an arc characteristic, it may indicate that an arc is extinguished after the arc is generated in the direct current. In this case, it may be considered that a previous arc causing the quantity of arc events to be increased by 1 has been extinguished, and therefore the quantity of arc events is decreased by 1 in step S708. In this way, the following problem is avoided. The quantity of arc events is increased excessively fast, and therefore it is frequently determined that an arc exists in the direct current, and then device shutdown is frequently triggered.

Step S709. Determine whether a counting result of the quantity of arc events is greater than or equal to a third threshold, and if the counting result of the quantity of arc events is greater than or equal to the third threshold, perform step S710, or if the counting result of the quantity of arc events is less than the third threshold, perform step S711.

The third threshold may be set using experimental data and the like. For example, the third threshold may be set to 10.

Step S710. Determine that an arc exists in the direct current.

After it is determined that an arc exists in the direct current, related measures in the other approaches may be taken to extinguish the arc. For example, in a PV power system, after it is determined that an arc exists in the direct current, an arc alarm may be triggered, and then a grid-tied inverter shutdown command may be triggered. In this case, both a grid-tied inverter and a grid-tied relay are disconnected, and the arc in the direct current is extinguished.

In step S710, When the quantity of arc events is greater than or equal to the third threshold, it is determined, for the following reason, that an arc exists in the direct current. An arc alarm is triggered after it is determined that an arc exists in a direct current of a device, and consequently the device shuts down. After the device shuts down, the device needs to be started up manually. If the arc alarm is frequently triggered, the device shuts down and is started up frequently. Therefore, the third threshold is set in step S709, and only when the counting result of the quantity of arc events is greater than or equal to the third threshold, it is determined that an arc exists in the direct current. In this way, the following problem is avoided. The quantity of arc events is increased excessively fast, and therefore it is frequently determined that an arc exists in the direct current, and then device shutdown is frequently triggered.

Step S711. Determine whether the quantity of arc events is less than the initial value, and if the quantity of arc events is less than the initial value, perform step S712, or if the quantity of arc events is not less than the initial value, perform step S713.

Step S712. Set the quantity of arc events to the initial value.

In step S708, when one of the at least one pulse does not have an arc characteristic and/or the frequency domain signal does not have an arc characteristic, the quantity of arc events is decreased by 1, and therefore the quantity of arc events may be less than the initial value. In practice, it is impossible that the quantity of arc events is less than the initial value. Therefore, an operation of setting the quantity of arc events to the initial value is set in step S712 in order to avoid reduced accuracy of the method for arc detection in the direct current that is caused when the quantity of arc events is less than the initial value.

Step S713. Determine whether there is a pulse that is not determined whether to have an arc characteristic in the at least one pulse, and if there is a pulse that is not determined whether to have an arc characteristic in the at least one pulse, return to step S704, or if there is not a pulse that is not determined whether to have an arc characteristic in the at least one pulse, return to step S702.

In the method for arc detection in the direct current shown in FIG. 7A and FIG. 7B, other steps than steps S702, S703, and S705 may be implemented by the microprocessor 204 in Embodiment 1.

In the method for arc detection in the direct current shown in FIG. 7A and FIG. 7B, the first circuit processes the current sampling signal of the direct current, and outputs the time domain signal including the at least one pulse, where the at least one pulse is used to indicate the time domain change rate of the current sampling signal, the second circuit processes the current sampling signal of the direct current, and outputs the frequency domain signal of the current sampling signal, when one of the at least one pulse has an arc characteristic and the frequency domain signal has an arc characteristic, the quantity of arc events used to indicate whether an arc exists in the direct current is increased by 1, and when the counting result of the quantity of arc events is greater than or equal to the third threshold, it is determined that an arc exists in the direct current.

Because the at least one pulse in the time domain signal reflects the time domain change rate of the current sampling signal, during analysis of the time domain signal, when a change rate of one of the at least one pulse falls within an arc change rate range, it may be determined that the pulse has an arc characteristic. Therefore, according to the method for arc detection in the direct current shown in FIG. 7A and FIG. 7B, a change of the current sampling signal caused by an environmental factor is not determined as an arc characteristic, thereby improving accuracy of arc detection in the direct current.

Figure 8A:
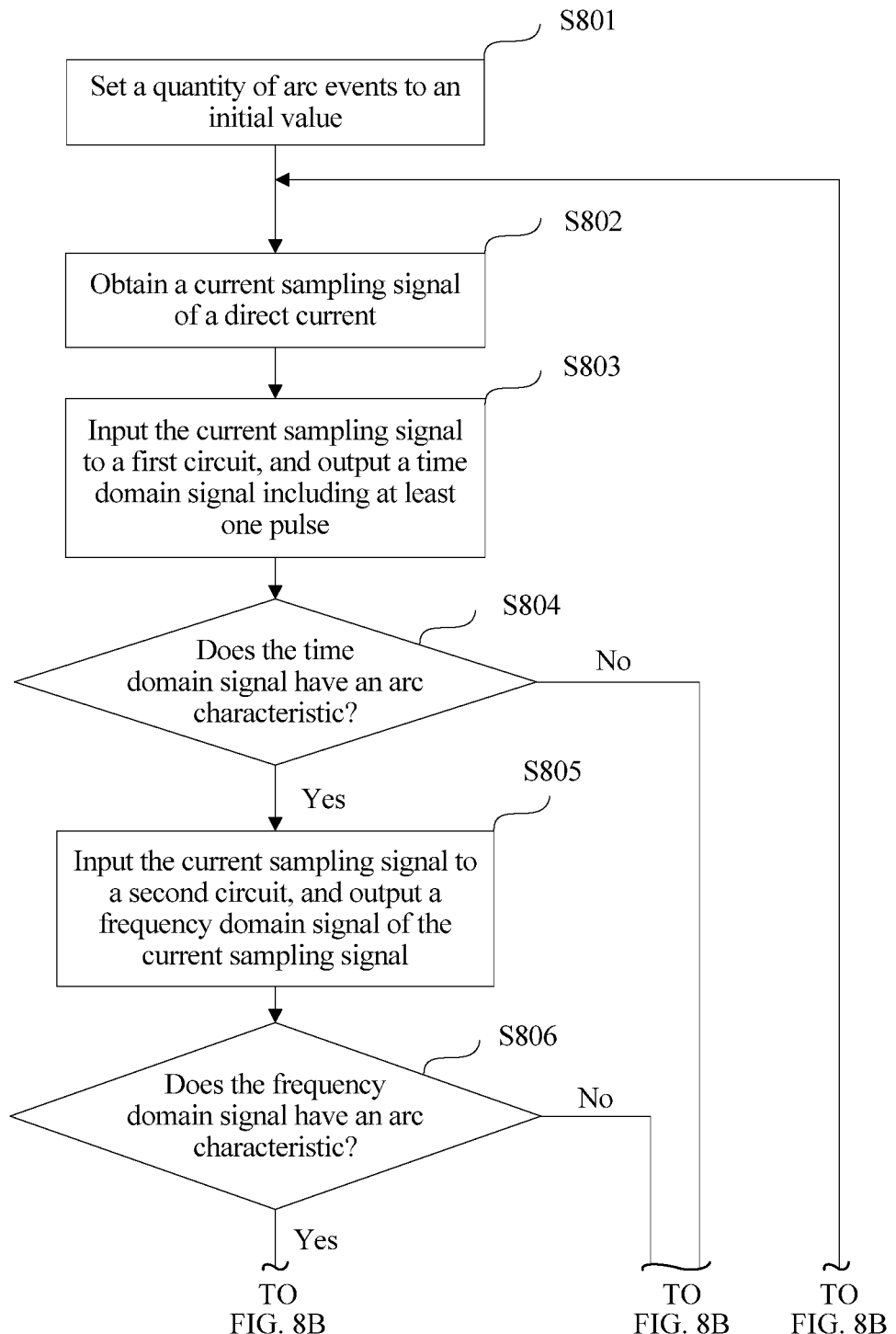
FIG. 8A and FIG. 8B are a schematic flowchart of another method for arc detection in a direct current according to an embodiment of the present disclosure.
Figure 8B:
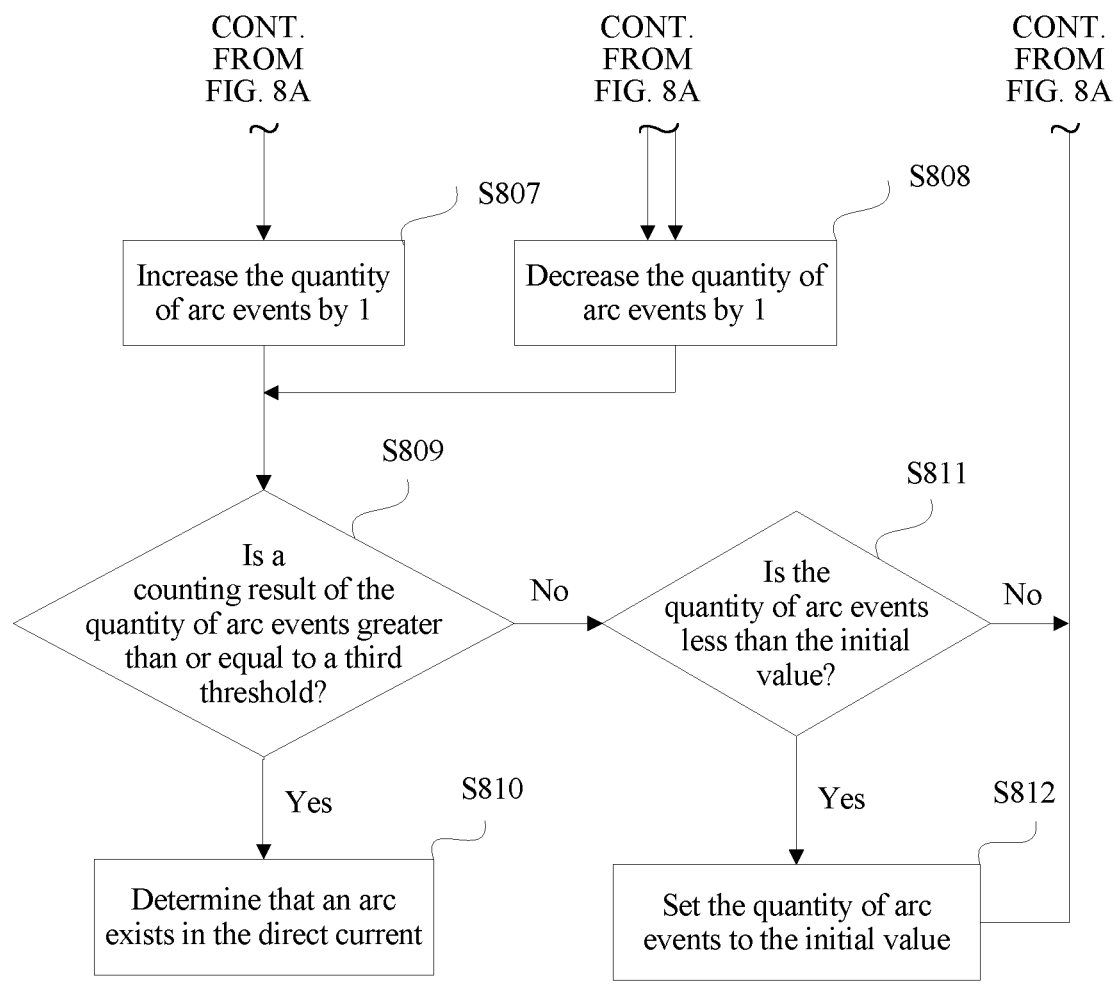

FIG. 8A and FIG. 8B show another method for arc detection in a direct current according to an embodiment of the present disclosure.

As shown in FIG. 8A and FIG. 8B, the method includes the following process.

Step S801. Set a quantity of arc events to an initial value.

The quantity of arc events is used to indicate whether an arc exists in a direct current, the arc event may indicate a possibility that an arc exists in the direct current, and a larger quantity of arc events indicates a higher possibility that an arc exists in the direct current.

For example, the initial value that is set for the quantity of arc events may be zero.

It should be noted that alternatively, the initial value that is set for the quantity of arc events may be another value, and values are not enumerated herein.

Step S802. Obtain a current sampling signal of a direct current.

The current sampling signal is an analog signal, and the current sampling signal may be obtained by disposing a current transformer on a direct current line on which the direct current is located.

Step S803. Input the current sampling signal to a first circuit, and output a time domain signal including at least one pulse.

In step S803, the at least one pulse included in the time domain signal is used to indicate a time domain change rate of the current sampling signal, and the time domain signal is used to determine whether the direct current has an arc characteristic in time domain.

Step S804. Determine whether the time domain signal has an arc characteristic, and if the time domain signal has an arc characteristic, perform step S805, or if the time domain signal does not have an arc characteristic, perform step S808.

Step S805. Input the current sampling signal to a second circuit, and output a frequency domain signal of the current sampling signal.

In Step S805, the second circuit may be a signal conditioning circuit, and the signal conditioning circuit amplifies and filters the current sampling signal, and outputs the frequency domain signal of the current sampling signal.

In the signal conditioning circuit, a high order filter may be selected as a filter. The high order filter has a relatively good frequency selection feature and can filter out noise in the current sampling signal.

In S805, the frequency domain signal is a signal used for performing frequency domain analysis on the direct current, and the frequency domain signal may be an analog signal or may be a digital signal.

When the frequency domain signal is a digital signal, a circuit configured to convert an analog signal into a digital signal needs to be disposed in the second circuit. When the frequency domain signal is an analog signal, a circuit configured to convert an analog signal into a digital signal needs to be disposed in a microprocessor.

In step S806, a specific manner of determining whether the time domain signal has an arc characteristic may include when there is a pulse whose width is greater than or equal to a second threshold in the at least one pulse, determining that the time domain signal has an arc characteristic, or when a width of each of the at least one pulse is greater than or equal to a second threshold, determining that the time domain signal has an arc characteristic.

The second threshold may be set using experimental data. For example, the second threshold may be 200 microseconds.

Step S806. Determine whether the frequency domain signal has an arc characteristic, and if yes, perform step S807, or if no, perform step S808.

A method for determining whether the frequency domain signal has an arc characteristic may include after fast Fourier transform is performed on the frequency domain signal, determining whether a high frequency component of the frequency domain signal is increased, or determining whether a frequency lower limit of the frequency domain signal is increased. The method for determining whether the frequency domain signal has an arc characteristic may be performed according to the other approaches, and details are not described herein.

It should be noted that in the process shown in FIG. 8A and FIG. 8B, an example is described in which it is first determined whether the time domain signal has an arc characteristic, and then it is determined whether the frequency domain signal has an arc characteristic. In practice, it may be first determined whether the frequency domain signal has an arc characteristic, and then it is determined whether the time domain signal has an arc characteristic. A determining sequence is not limited in this embodiment of the present disclosure.

Step S807. Increase the quantity of arc events by 1.

Increasing the quantity of arc events by 1 indicates that the possibility that an arc exists in the direct current grows.

Step S808. Decrease the quantity of arc events by 1.

Decreasing the quantity of arc events by 1 indicates that the possibility that an arc exists in the direct current reduces.

Step S808 is set for the following purpose. When an arc exists in the direct current, the arc may be extinguished by itself. When the time domain signal does not have an arc and/or the frequency domain signal does not have an arc characteristic, it may indicate that an arc is extinguished after the arc is generated in the direct current. In this case, it may be considered that a previous arc causing the quantity of arc events to be increased by 1 has been extinguished, and therefore an operation of decreasing the quantity of arc events by 1 is set in step S808. In this way, the following problem is avoided. The quantity of arc events is increased excessively fast, and therefore it is frequently determined that an arc exists in the direct current, and then device shutdown is frequently triggered.

By performing the operation in step S808, the following problem is also avoided. The quantity of arc events is increased excessively fast, and therefore it is frequently determined that an arc exists in the direct current, and then device shutdown in step S810 is frequently triggered.

Step S809. Determine whether a counting result of the quantity of arc events is greater than or equal to a third threshold, and if yes, perform step S810, or if no, perform step S811.

The third threshold may be set using experimental data and the like. For example, the third threshold may be set to 10.

Step S810. Determine that an arc exists in the direct current.

After it is determined that an arc exists in the direct current, related measures in the other approaches may be taken to extinguish the arc. For example, in a PV power system, after it is determined that an arc exists in the direct current, an arc alarm may be triggered, and then a grid-tied inverter shutdown command may be triggered. In this case, both a grid-tied inverter and a grid-tied relay are disconnected, and the arc in the direct current is extinguished.

In step S810, when the counting result of the quantity of arc events is greater than or equal to the third threshold, it is determined, for the following reason, that an arc exists in the direct current. An arc alarm is triggered after it is determined that an arc exists in a direct current of a device, and consequently the device shuts down. After the device shuts down, the device needs to be started up manually. If the arc alarm is frequently triggered, the device shuts down and is started up frequently. Therefore, the third threshold is set in step S809, and only when the counting result of the quantity of arc events is greater than or equal to the third threshold, it is determined that an arc exists in the direct current. In this way, the following problem is avoided. The quantity of arc events is increased excessively fast, and therefore it is frequently determined that an arc exists in the direct current, and then device shutdown is frequently triggered.

Step S811. Determine whether the quantity of arc events is less than the initial value, and if yes, perform step S812, or if no, return to step S802.

Step S812. Set the quantity of arc events to the initial value.

In step S808, when the time domain signal does not have an arc characteristic and/or the frequency domain signal does not have an arc characteristic, the quantity of arc events is decreased by 1, and therefore the quantity of arc events may be less than the initial value. In practice, it is impossible that the quantity of arc events is less than the initial value. Therefore, an operation of setting the quantity of arc events to the initial value is set in step S812 in order to avoid reduced accuracy of the method for arc detection in the direct current that is caused when the quantity of arc events is less than the initial value.

After the quantity of arc events is set to the initial value in steps S812, S802 is performed again.

In the method for arc detection in the direct current shown in FIG. 8A and FIG. 8B, other steps than steps S802, S803, and S805 may be implemented by the microprocessor 204 in Embodiment 1.

In the method for arc detection in the direct current shown in FIG. 8A and FIG. 8B, the first circuit processes the current sampling signal of the direct current, and outputs the time domain signal including the at least one pulse, where the at least one pulse is used to indicate the time domain change rate of the current sampling signal, the second circuit processes the current sampling signal of the direct current, and outputs the frequency domain signal of the current sampling signal, when the time domain signal has an arc characteristic and the frequency domain signal has an arc characteristic, the quantity of arc events used to indicate whether an arc exists in the direct current is increased by 1, and when the counting result of the quantity of arc events is greater than or equal to the third threshold, it is determined that an arc characteristic exists in the direct current.

Because the time domain signal reflects the time domain change rate of the current sampling signal, during analysis of the time domain signal, when the change rate of the time domain signal falls within an arc change rate range, it may be determined that the time domain signal has an arc characteristic. Therefore, according to the method for arc detection in the direct current shown in FIG. 8A and FIG. 8B, a change of the current sampling signal caused by an environmental factor is not determined as an arc characteristic, thereby improving accuracy of arc detection in the direct current.

A difference between the method for arc detection in the direct current shown in FIG. 7A and FIG. 7B and the method for arc detection in the direct current shown in FIG. 8A and FIG. 8B is as follows. In the method shown in FIG. 7A and FIG. 7B, an arc characteristic of the time domain signal is determined for one of the at least one pulse, and the method may be applied to a scenario in which a sampling time of the current sampling signal is relatively long. In the method shown in FIG. 8A and FIG. 8B, an arc characteristic of the time domain signal is determined for the current sampling signal of the direct current, and the method may be applied to a scenario in which a sampling time of the current sampling signal is relatively short.

In the embodiments of the present disclosure, the circuit for arc detection in the direct current includes the current sampling circuit, the first circuit, the second circuit, and the microprocessor. The current sampling circuit is configured to perform current sampling on the direct current, and output the current sampling signal of the direct current. The first circuit is configured to receive the current sampling signal and output, after processing the current sampling signal, the time domain signal including the at least one pulse, where the at least one pulse is used to indicate the time domain change rate of the current sampling signal. The second circuit is configured to receive the current sampling signal, and output the frequency domain signal of the current sampling signal after amplifying and filtering the current sampling signal. The microprocessor is configured to receive the time domain signal output by the first circuit and the frequency domain signal output by the second circuit, count the quantity of arc events based on the results of analysis on the time domain signal and the frequency domain signal, and when the counting result of the quantity of arc events meets the preset condition, determine that an arc exists in the direct current.

Because the at least one pulse in the time domain signal reflects the time domain change rate of the current sampling signal, when analyzing the time domain signal, the microprocessor needs to consider whether the time domain change rate of the current sampling signal falls within an arc change rate range. Therefore, according to the technical solutions provided in the embodiments of the present disclosure, when an environmental factor causes a change of the current sampling signal, it is not considered by mistake that an arc exists in the direct current, thereby improving accuracy of a detection result of the circuit for arc detection in the direct current.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a compact disc read-only memory (CD-ROM), an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams, and a combination of a process and/or a block in the flowcharts and/or the block diagrams. These computer program instructions may be provided for a general-purpose computer, a dedicated computer, an embedded processor, or a processor of another programmable data processing device to generate a machine such that the instructions executed by the computer or the processor of the other programmable data processing device generate an apparatus for implementing a specified function in one or more processes in the flowcharts and/or in one or more blocks in the block diagrams.

These computer program instructions may be stored in a computer readable memory that can instruct a computer or another programmable data processing device to work in a specific manner such that the instructions stored in the computer readable memory generate an artifact that includes an instruction apparatus. The instruction apparatus implements a specified function in one or more processes in the flowcharts and/or in one or more blocks in the block diagrams.

These computer program instructions may also be loaded onto a computer or another programmable data processing device such that a series of operations and steps are performed on the computer or the other programmable device, thereby generating computer-implemented processing. Therefore, the instructions executed on the computer or the other programmable device provides steps for implementing a specified function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover the preferred embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A circuit for arc detection in a direct current, comprising:
   a current sampling circuit configured to:
      perform current sampling on the direct current; and
      output a current sampling signal of the direct current;
   a first circuit coupled to the current sampling circuit and configured to:
      receive the current sampling signal from the current sampling circuit; and
      output a time domain signal after processing the current sampling signal, the time domain signal comprising at least one pulse, and the at least one pulse indicating a time domain change rate of the current sampling signal;
   a second circuit coupled to the current sampling circuit and configured to:
      receive the current sampling signal from the current sampling circuit; and
      output a frequency domain signal of the current sampling signal after amplifying and filtering the current sampling signal; and
   a microprocessor coupled to the first circuit and the second circuit and configured to:
      receive the time domain signal from the first circuit;
      receive the frequency domain signal from the second circuit;
      count a quantity of arc events based on results of analysis on the time domain signal and the frequency domain signal by increasing the quantity of arc events by one when a width of the at least one pulse is greater than or equal to a first threshold and the frequency domain signal has an arc characteristic; and
      identify that an arc exists in the direct current when a counting result of the quantity of arc events meets a preset condition.

2. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
   analyze, in a specified sequence, one of the at least one pulse comprised in the time domain signal; and
   decrease the quantity of arc events by one when the width of the one of the at least one pulse is less than the first threshold.

3. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
   decrease the quantity of arc events by one when there is not a pulse whose width is greater than or equal to a second threshold in the at least one pulse comprised in the time domain signal and the frequency domain signal does not have the arc characteristic; and
   decrease the quantity of arc events by one when there is a pulse whose width is less than the second threshold in the at least one pulse comprised in the time domain signal and the frequency domain signal does not have the arc characteristic.

4. The circuit of claim 1, wherein when identifying that the arc exists in the direct current, the microprocessor is further configured to identify that the arc exists in the direct current when the counting result of the quantity of arc events is greater than or equal to a second threshold.

5. The circuit of claim 1, wherein the microprocessor is further configured to set the quantity of arc events to an initial value when the counting result of the quantity of arc events is less than the initial value.

6. The circuit of claim 1, wherein the first circuit comprises:
a differentiating circuit configured to:
perform a differential operation on the current sampling signal; and
output a first signal having the time domain change rate of the current sampling signal;
an amplification circuit coupled to the differentiating circuit and configured to:
receive the first signal from the differentiating circuit;
amplify an amplitude of the first signal to specified times; and
output a second signal;
a hysteresis comparator circuit coupled to the amplification circuit and configured to:
receive the second signal from the amplification circuit;
process the second signal according to a first preset rule to obtain a third signal; and
output the third signal, the first preset rule comprising outputting a forward pulse signal when an amplitude of the second signal is greater than or equal to a second threshold, and outputting a negative pulse signal when the amplitude of the second signal is less than the second threshold;
an amplitude limiting circuit coupled to the hysteresis comparator circuit and configured to:
receive the third signal from the hysteresis comparator circuit;
process the third signal according to a second preset rule to obtain a fourth signal; and
output the fourth signal, the second preset rule comprising setting an amplitude of the negative pulse signal to zero, setting an amplitude of the forward pulse signal to a third threshold when the amplitude of the forward pulse signal is greater than or equal to the third threshold, and keeping the amplitude of the forward pulse signal unchanged when the amplitude of the forward pulse signal is less than the third threshold; and
a waveform shaping circuit coupled to the amplitude limiting circuit and configured to output the time domain signal comprising the at least one pulse, and a width of each of the at least one pulse comprising at least one time unit.

7. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
analyze, in a specified sequence, the at least one pulse comprised in the time domain signal; and
decrease the quantity of arc events by one when the frequency domain signal does not have the arc characteristic.

8. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
decrease the quantity of arc events by one when there is not a pulse whose width is greater than or equal to a second threshold in the at least one pulse comprised in the time domain signal; and
decrease the quantity of arc events by one when there is a pulse whose width is less than the second threshold in the at least one pulse comprised in the time domain signal and the frequency domain signal does not have the arc characteristic.

9. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
decrease the quantity of arc events by one when the frequency domain signal does not have the arc characteristic; and
decrease the quantity of arc events by one when there is a pulse whose width is less than a second threshold in the at least one pulse comprised in the time domain signal and the frequency domain signal does not have the arc characteristic.

10. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
decrease the quantity of arc events by one when there is not a pulse whose width is greater than or equal to a second threshold in the at least one pulse comprised in the time domain signal and the frequency domain signal does not have the arc characteristic; and
decrease the quantity of arc events by one when there is a pulse whose width is less than the second threshold in the at least one pulse comprised in the time domain signal.

11. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:
decrease the quantity of arc events by one when there is not a pulse whose width is greater than or equal to a second threshold in the at least one pulse comprised in the time domain signal and the frequency domain signal does not have the arc characteristic; and
decrease the quantity of arc events by one when the frequency domain signal does not have the arc characteristic.

12. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:

decrease the quantity of arc events by one when there is not a pulse whose width is greater than or equal to a second threshold in the at least one pulse comprised in the time domain signal; and decrease the quantity of arc events by one when there is a pulse whose width is less than the second threshold in the at least one pulse comprised in the time domain signal.

13. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:

decrease the quantity of arc events by one when there is not a pulse whose width is greater than or equal to a second threshold in the at least one pulse comprised in the time domain signal; and decrease the quantity of arc events by one when the frequency domain signal does not have the arc characteristic.

14. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:

decrease the quantity of arc events by one when the frequency domain signal does not have the arc characteristic; and decrease the quantity of arc events by one when there is a pulse whose width is less than a second threshold in the at least one pulse comprised in the time domain signal.

15. The circuit of claim 1, wherein the microprocessor is further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to decrease the quantity of arc events by one when the frequency domain signal does not have the arc characteristic.

16. A microprocessor, configured to:

receive a time domain signal from a first circuit and a frequency domain signal from a second circuit;

count a quantity of arc events based on results of analysis on the time domain signal and the frequency domain signal by increasing the quantity of arc events by one when a width of at least one pulse comprised in the time domain signal is greater than or equal to a first threshold and the frequency domain signal has an arc characteristic; and identify that an arc exists in a direct current when a counting result obtained by counting the quantity of arc events meets a preset condition.

17. The microprocessor of claim 16, further configured to set the quantity of arc events to an initial value before receiving the time domain signal from the first circuit and the frequency domain signal from the second circuit, and when counting the quantity of arc events based on the results of the analysis on the time domain signal and the frequency domain signal, the microprocessor being further configured to:

analyze, in a specified sequence, the at least one pulse comprised in the time domain signal; and decrease the quantity of arc events by one when the width of the at least one pulse is less than the first threshold or the frequency domain signal does not have the arc characteristic.

18. The microprocessor of claim 16, further configured to set the quantity of arc events to an initial value before receiving the time domain signal from the first circuit and the frequency domain signal from the second circuit, and when counting the quantity of arc events based on the results of analysis on the time domain signal and the frequency domain signal, the microprocessor being further configured to:

decrease the quantity of arc events by one when the width of the at least one pulse comprised in the time domain signal is less than a second threshold or the frequency domain signal does not have the arc characteristic; and decrease the quantity of arc events by one when the width of the at least one pulse comprised in the time domain signal is less than the second threshold or the frequency domain signal does not have the arc characteristic.

19. The microprocessor of claim 17, wherein when identifying that the arc exists in the direct current, the microprocessor is further configured to identify that the arc exists in the direct current when the counting result obtained by counting the quantity of arc events is greater than or equal to a second threshold.

20. The microprocessor of claim 16, further configured to set the quantity of arc events to an initial value when the counting result obtained by counting the quantity of arc events is less than the initial value.

* * * * *